United States Patent [19]

Haond

[11] Patent Number: 5,330,617
[45] Date of Patent: Jul. 19, 1994

[54] METHOD FOR ETCHING INTEGRATED-CIRCUIT LAYERS TO A FIXED DEPTH AND CORRESPONDING INTEGRATED CIRCUIT

[75] Inventor: Michel Haond, Meylan, France
[73] Assignee: France Telecom, France
[21] Appl. No.: 792,262
[22] Filed: Nov. 15, 1991

[30] Foreign Application Priority Data

Nov. 16, 1990 [FR] France .................. 90 14306

[51] Int. Cl.$^5$ ............................ B05D 5/00
[52] U.S. Cl. .................. 156/646; 156/652; 156/653; 156/655; 156/657; 156/661.1
[58] Field of Search .............. 156/652, 653, 655, 657, 156/661.1, 662, 644, 643, 646, 659.1; 437/228

[56] References Cited

U.S. PATENT DOCUMENTS

| | | | |
|---|---|---|---|
| 4,142,926 | 3/1979 | Morgan | 156/653 X |
| 4,174,252 | 11/1979 | Kressel et al. | 156/653 |
| 4,268,951 | 5/1991 | Elliott et al. | |
| 4,436,593 | 3/1984 | Osborne et al. | 156/653 X |
| 4,576,834 | 3/1986 | Sobczak | 156/653 X |
| 4,589,952 | 5/1986 | Behringer et al. | 156/653 X |
| 4,634,495 | 1/1987 | Gobrecht et al. | |
| 4,648,937 | 3/1987 | Ogura et al. | 156/653 X |
| 4,801,554 | 1/1989 | Gobrecht et al. | 156/653 X |
| 4,832,788 | 5/1989 | Nemiroff | 156/653 X |
| 4,832,789 | 5/1989 | Cochran et al. | 156/653 X |
| 4,837,180 | 6/1989 | Chao | |
| 5,047,117 | 9/1991 | Roberts | 156/653 X |
| 5,118,384 | 6/1992 | Harmon et al. | 156/653 X |

FOREIGN PATENT DOCUMENTS

314522  5/1989  European Pat. Off.

OTHER PUBLICATIONS

C. C. Beatty et al., 1987 Proceedings Fourth International IEEE VLSI Multilevel Interconn. Conference, *Multilevel Tungsten.*
*Integrated Circuit Metallization with Chromium Non-Erodible Mask and Etch Stop Layers,* Jun. 15-16, 1987, pp. 163-168 (& cvr).

*Primary Examiner*—Thi Dang
*Attorney, Agent, or Firm*—Larson and Taylor

[57] ABSTRACT

The invention relates to a method for etching an integrated-circuit layer to a fixed depth. The method consists in depositing onto the layer to be etched a protective layer forming a stop layer and then onto the latter a reference layer made of a material compatible with that of the layer to be etched the thickness of the reference layer being proportional to the depth of the etch to be produced. A mask is applied to the reference layer and the etching of this layer is carried out by chemical attack until encountering the stop layer. After removal of the mask and of the stop layer, in the etching zone, the reference layer and the layer of material to be etched 1 are simultaneously subjected to a chemical attack until encountering the stop layer. An etch having the plane dimensions of the etch of the reference layer and a depth proportional to the thickness of the reference layer is thus created. Application to the etching of integrated-circuit layers or to the creation of inverted-T-shaped elements.

6 Claims, 4 Drawing Sheets

METHOD FOR ETCHING INTEGRATED-CIRCUIT LAYERS TO A FIXED DEPTH AND CORRESPONDING INTEGRATED CIRCUIT

The invention relates to a process for etching integrated-circuit layers to a fixed depth and to the corresponding integrated circuit.

The manufacture of an integrated circuit results from a sequence of elementary steps such as, for example, photolithography, etching, ion implantation and thermal treatment steps.

As the processes for the manufacture of ever denser and smaller and smaller integrated circuits have evolved, the implementation of each elementary step becomes more delicate and requires increased precision and reproducibility capability.

In sub-micron processes, the fixed-time pattern etching operations, that is to say the etching processes in which the etch depth is determined by the time for implementing the etching process for a material of specified nature and for a given etch mode or chemical etchant with respect to this material, multiply. This is the case, especially, for isolation trench etching operations or for the manufacture of polycrystalline silicon grids called "inverted T"-type grids.

Despite all the precautions taken for implementing the abovementioned processes, the latter cannot expect to achieve the accuracy and reproducibility qualities mentioned hereinabove, in particular because of the inadequacy of this type of process in switching or passing from etch state to non-etch state, it being impossible to expect such switching to be instantaneous, which has the effect of introducing a zone of uncertainty, which is non-zero, in the depth effectively achieved by the etching operation, with risk of local or general non-uniformity of the physical characteristics of the materials to be etched and therefore of their etch rates from one integrated circuit to another, it being well known that these etch parameters depend on the operating conditions even in the case of integrated circuits of the same type.

The object of the present invention is to overcome the abovementioned drawbacks and, especially, to increase substantially the precision of the etching of integrated-circuit layers in the sub-micron domain.

Another object of the present invention is to increase substantially the reproducibility capability from one integrated circuit to another of the same type.

A further object of the present invention is to implement a method for etching a layer of material of an integrated circuit to a fixed depth and of the corresponding integrated circuit.

The method for etching a layer of material of an integrated circuit, the layer to be etched, over a fixed depth, which is a subject of the present invention, is noteworthy in that it consists in depositing onto the layer of material, the layer to be etched, a protective layer forming a stop layer and in depositing onto this stop layer a reference layer made of a material compatible with that of the layer to be etched and whose thickness is made substantially proportional to the thickness of the etch to be produced in said layer to be etched. An etch mask having the plane dimensions of the etch to be produced in the layer to be etched is applied to the reference layer and the etching of this layer is carried out by chemical attack by the intermediary of the etch mask, until encountering the stop layer in the zone for etching the reference layer. The mask and the stop layer in the zone for etching the reference layer are removed, and the reference layer and the layer of material to be etched are simultaneously subjected to a chemical attack until encountering the stop layer, the reference layer and the stop layer forming an auxiliary mask for the layer to be etched so as to create, in the layer to be etched, an etch having the plane dimensions of the etch of the reference layer and a depth substantially proportional to the thickness of this reference layer.

According to a first embodiment, the integrated circuit, which is a subject of the present invention, is noteworthy in that it comprises at least, in a substrate of specified material, one channel-type zone, the free surface of said substrate in the vicinity of said channel-type zone comprising a covering of a layer made of a different material from that of the substrate.

According to a second embodiment, the integrated circuit, which is a subject of the invention, is noteworthy in that it comprises, at least on a substrate of specified material, one projection-type zone, this projection-type zone being formed by the same material superposed on the surface of the substrate and having substantially the shape of an inverted T.

BRIEF DESCRIPTION OF THE DRAWINGS

A more detailed description of the subject of the present invention will now be given in conjunction with the description and with the drawings hereinbelow in which.

DETAILED DESCRIPTION OF THE INVENTION

The method for etching a layer of material of an integrated circuit to a fixed depth, according to the present invention, will first of all be described in conjunction with FIGS. 1(a)–1(e). According to the abovementioned Figure, the method according to the invention consists, as shown in of FIG. 1(a), in depositing a protective layer forming a stop layer, designated by 2, on the layer of material constituting the layer to be etched 1.

Figure 1A:
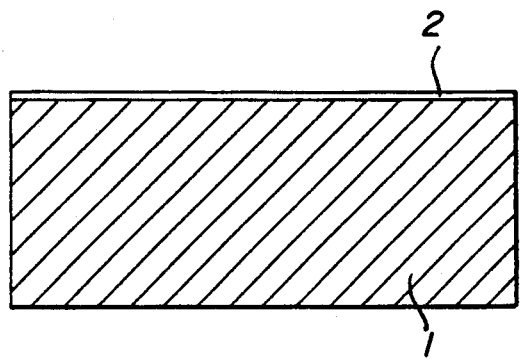
FIGS. 1(a)–1(e) illustrates the implementation of the method, which is a subject of the invention, for etching to a fixed depth.
Figure 1B:
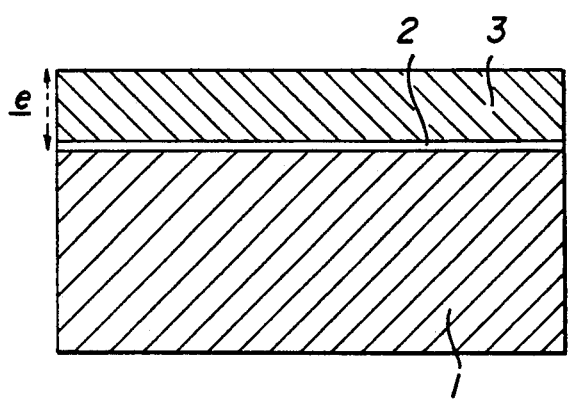

Subsequently, as shown in FIG. 1b, the method according to the invention consists in depositing, on the stop layer 2, a layer called the reference layer, designated by 3, made of a material compatible with that of the layer to be etched 1. By material compatible with that of the layer to be etched 1, is understood any type of material capable of being simultaneously etched with the layer to be etched 1, under similar or identical operating conditions, as will be described later in the description.

According to a particular aspect of the method which is a subject of the invention, the thickness of the reference layer 3 is made substantially proportional to the depth of the etch to be produced in the layer to be etched 1. Of course, as will be described later in the description, it will be understood that the coefficient of proportionality connecting the values of the two respective thicknesses of the reference layer 3 and the depth of the etch to be produced is determined as a function of the operating conditions of the respective etching operations of these layers.

Figure 1C:
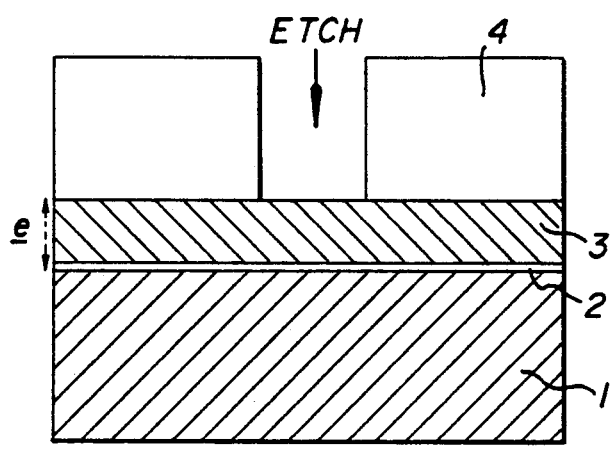
Figure 1D:
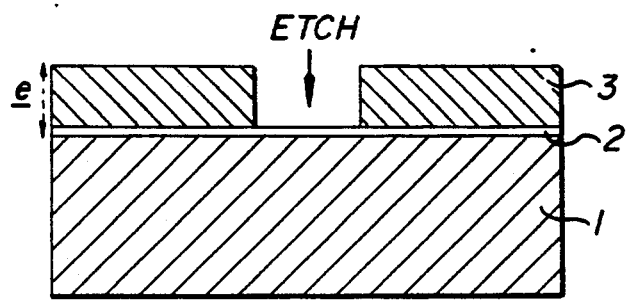

As has been furthermore shown FIG. 1(d), the method which is a subject of the invention then consists successively in applying to the reference layer 3 an etch mask 4 having the plane dimensions of the etch to be produced in the layer to be etched 1, and then in carrying out the etching by chemical attack, dry or wet, of the reference layer 3 by the intermediary of the etch mask 4 until encountering the stop layer 2. The encounter with the stop layer is meant the encounter, in the zone for etching, of the reference layer 3.

As has then been shown by FIG. 1(d), the method according to the invention then consists in removing the etch mask 4 and the stop layer 2 in the zone for etching the reference layer 3. The removal of the stop layer 2 may be carried out by chemical attack, dry or wet.

Figure 1E:
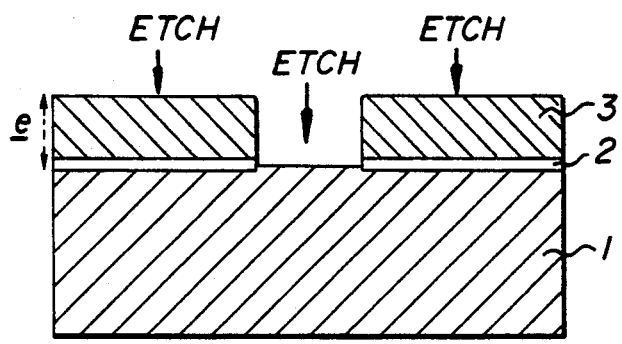

Subsequently, as shown by FIG. 1(e), the method which is a subject of the invention then consists in simultaneously subjecting the reference layer 3 and the layer of material to be etched 1, in the region of the zone liberated by the removal of the stop layer 2 at the preceding step (e), to a simultaneous chemical attack. The simultaneous chemical attack of the reference layer 3 and of the layer of material to be etched 1 is continued until encountering the stop layer 2, subjacent to the reference layer 3, after disappearance of the latter.

During the operation carried out, as illustrated in FIG. 1(e), for the implementation of the method which is a subject of the invention, the reference layer 3 and the stop layer 2 form an auxiliary mask for the layer to be etched 1, so as to create in the abovementioned layer to be etched 1 an etch having the plane dimensions of the etch of the reference layer 3 and a depth substantially proportional to the thickness of the abovementioned reference layer 3.

Figure 1F:
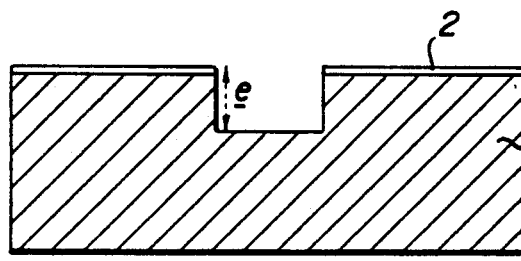

In FIG. 1(f), there is shown the layer etched to a fixed depth of an integrated circuit, obtained by the implementation of the method represented by the steps shown in FIGS. 1(a)–1(e).

It will, of course, be understood that the operating conditions for etching and for chemical attack of the reference layer 3 and of the layer to be etched 1 may then be chosen so as to obtain an etch depth of the layer to be etched 1 proportional to the thickness of the reference layer 3, this, for example, by fixing the relative etch rates of the reference layer 3 and of the layer to be etched 1 by a judicious choice of the etchants and of the operating conditions of these etchants.

In a simplified embodiment of the method which is a subject of the invention, the reference layer 3 may advantageously be constituted by a material identical to that of the layer to be etch 1. In this case, the reference layer 3 then has a thickness e substantially equal to the etch depth to be produced in the layer to be etched 1. Of course, the simultaneous etching of the reference layer 3 and of the layer to be etched 1 is carried out by the intermediary of the same etchants under substantially identical operating conditions.

A second embodiment of the method which is a subject of the invention will be advantageously described in the case where this method is implemented with a view to adding onto a layer of material of an integrated circuit a raised element of specified height. In general, the raised element of specified height added onto the layer of material of an integrated circuit is an inverted-T-type element, according to the usual terminology for this type of raised element in the technical domain of the production of integrated circuits.

Figure 2A:
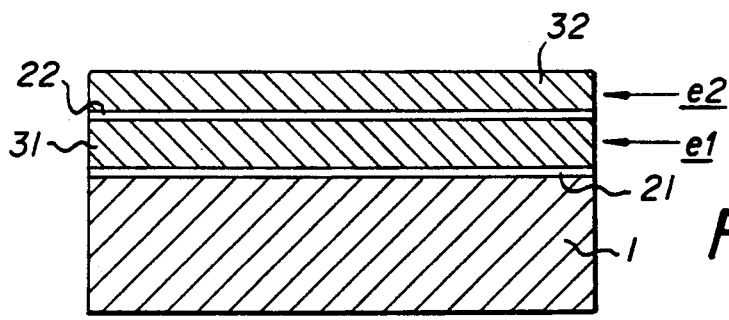
FIGS. 2(a)–2(d) illustrate the implementation of the method, which is a subject of the invention, more particularly intended for producing inverted T-shaped elements.

As has been shown in FIG. 2(a), the method which is a subject of the invention then consists in successively repeating the steps a) previously described in conjunction with FIGS. 1(a) and 1(b), so as to form on the layer to be etched 1 a reference layer 31 and then a upper reference layer 32. It will be noted that the reference layer 31 and the upper reference layer 32 are preferably layers of the same type and of the same thickness. Likewise, by repeating the preceding steps described in conjunction with Figures (a) and (b), the reference layer 31 and the upper reference layer 32 are associated respectively with their stop layer 21 and upper stop layer 22.

Figure 2B:
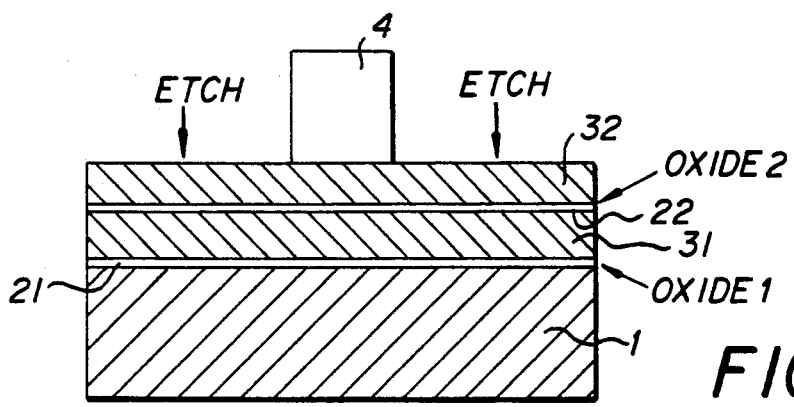

The method which is a subject of the present invention, as shown in FIG. 2(b), then consists in carrying out the steps previously described in relation with FIGS. 1(c) and (f), relative to the upper reference layer 32 and to the upper stop layer 22, so as to form, in the region of the reference layer 31, a raised element to be added which forms an auxiliary mask for the reference layer 31.

Figure 2C:
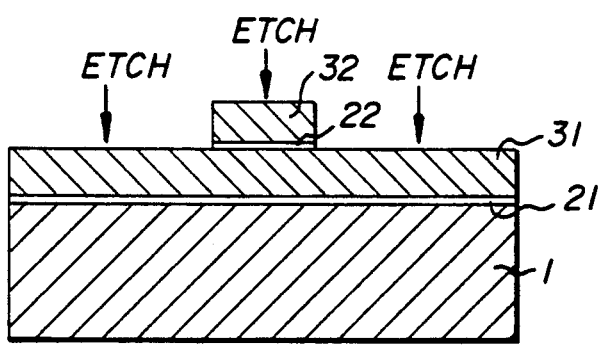

The operation as shown by FIG. 2(b) is then followed, as shown by FIG. 2(c), by an operation then consisting in simultaneously subjecting the reference layer 31 and the raised element of the upper reference layer 32 forming an auxiliary mask, to a chemical attack until encountering the stop layer 21 so as to form in the region of the reference layer 31 the raised element added onto the layer of material to be etched 1.

It will, of course, be understood that the method which is a subject of the present invention, as much in its first embodiment such as illustrated in FIGS. 1(a)–1(f) as in its second embodiment such as illustrated in FIGS. 2(a) and 2(c), may be implemented in relation to any type of material normally used for the manufacture of integrated circuits and especially for layers to be etched 1 constituted by a material such as silicon oxide $SiO_2$, silicon nitride $Si_3N_4$ or single crystal or polycrystalline silicon Si.

Furthermore it will be noted that, in the case for implementing the method which is a subject of the invention such as illustratively shown by FIG. 2, the reference layer 31 and the upper reference layer 32 may be of the same type or of a different type.

In every case for implementing the method which is a subject of the invention, the thickness dimension of the reference layer with respect to the layer to be etched 1 or of the upper reference layer with respect to the reference layer 31 is made equal to a value proportional to the dimension in the same direction either of the etch to be produced in the layer to be etched 1 or, respectively, of the inverted-T element 31 to be added onto the layer to be etched 1. The proportionality ratio of these dimensions is then made equal, for compatible materials constituting the reference layer 3 or upper reference layer 32, for appropriate etch modes or chemical etchants with respect to the layer of material to be etched 1 and of the reference layer 3 or of the reference layer 31 and of the upper reference layer 32, to the ratio of the corresponding etch rates.

It will, of course, be understood that when the layer to be etched 1 and the reference layer 3, respectively, the reference layer 31 and the upper reference layer 32 are made from identical materials, the thickness dimensions e are then substantially identical. The reference layer and the layer to be etched 1 or upper reference layer 32 and reference layer 31 are then subjected, with a view to their etching, to the same etch modes or chemical etchants.

It will, in particular, be noted that, for materials constituting layers to be etched or reference layers or upper reference layers previously described, the chemical etchants may be chosen from among the group hereinbelow:

| Materials (1) and/or (3) | Dry etch gas | Liquid |
| --- | --- | --- |
| Single crystal Si | $CF_4$—$Cl_2$ | KOH |
| Polycrystalline Si | $SF_6$—$Cl_2$ | HF—$HNO_3$ |
| Amorphous Si | HCl—$Cl_2$ | |
| Silicon nitride | HCl—$Cl_2$ | |
| Thermal $SiO_2$ | $C_2F_6$—$CHF_3$ | HF |
| Deposited $SiO_2$ | $SF_6$—$CHF_3$ | HF, dilute or buffered |

Furthermore, it is pointed out that the chemical agent may be constituted by a mixture of $SF_6$ or $C_2F_6$ with $CHF_3$ in specified proportions. The etch modes or chemical etchants may comprise $CF_4$ and $O_2$.

As regards the practical implementation of the method which is a subject of the invention, such as shown in FIGS. 1(a)-1(f), the latter may be implemented under the conditions hereinbelow.

The deposition of the reference layer 3 onto the stop layer 2 may advantageously be carried out, in the case where the layer to be etched 1 is a silicon layer, by the deposition onto the stop layer 2 of a silicon thickness which is slightly less than but in the vicinity of the depth of the etch or trench to be produced, in order to constitute the reference layer 3. The deposition of the etch mask 4, as shown by FIG. 1(c), may then be carried out by depositing onto the reference layer 3 a resin in which an opening is made, for example by a photolithographic process, having the plane dimensions of the etch to be produced.

The etching of the reference layer 3, such as shown in of FIG. 1(d), may then be carried out by means of an anisotropic etching process by using the stop layer 2, constituted for example by a silicon oxide layer, as a stop layer with end-of-etch detection. The resin mask 4 may then be removed or not.

The stop layer 2 may then be etched in the region of the opening or zone made in the reference layer 3 by using either the resin mask 4 over the reference layer 3 or the reference layer 3 itself as a mask.

The resin forming the etch mask 4 having been removed, if the latter was still present, the simultaneous etching of the reference layer 3 and of the layer to be etched 1 is carried out, as shown by FIG. 1(e), with the aid of an anisotropic etching processing. Of course, it is understood that the simultaneous etching of the reference layer 3 and of the layer to be etched 1 is then continued until encountering the stop layer 2 subjacent to the reference layer 3, which makes it possible, by end-of-etch detection on encountering this stop layer 2, to stop likewise the etching of the layer to be etched 1.

Of course, it will be understood that a slight overetching may be carried out in order to be certain of having completely removed the reference layer 3 on the stop layer 2. Thus, the depth of the etch on the layer to be etched 1 is equal to the thickness of the reference layer 3 initially deposited plus a slight portion corresponding to the abovementioned overetching, this overetching being, of course, easily calibratable and corresponding generally to a very short time compared to the total etching time.

In accordance with the embodiment such as shown in FIG. 2 of the method which is the subject of the invention, in the case of the production inverted-T-type raised elements, the method such as illustrated in Figure (a) and (b), are successively repeated so as to deposit onto the layer called the layer to be etched, although the latter is not etched as such, a reference layer designated by 31 and an upper reference layer designated by 32, and their respective stop layers 21 and 22. Preferably, when the reference layer 31 and the upper reference layer 32 are constituted by the same material such as silicon, the reference layer 31 may have a thickness e1 and the upper reference layer 32 a thickness e2 different from e1. The thickness e2 is then less than but in the vicinity of the height desired for the vertical portion of the inverted T, constituting in fact a step added onto the layer to be etched 1.

Then, in accordance with FIG. 2(b), an etch mask 4 constituted by a resin is applied, this mask being fashioned by a photolithographic process so as to keep the mask 4 in the region of the surfaces corresponding to the top of the steps, that is to say at the vertical portion of the inverted T.

As has been shown by FIG. 2(c), the upper reference level 32 is then subjected to an etching process in the presence of the mask 4 until reaching the upper stop layer 22, with end-of-etch detection and stopping of the process for etching the upper layer 32. The abovementioned etching is carried out, of course, by means of an anisotropic etching operation. The resin mask 4 may then be removed or not.

Figure 2D:
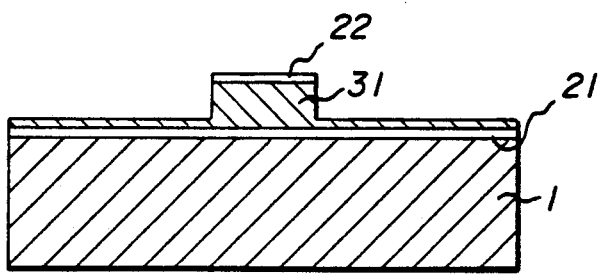

The assembly such as shown by FIG. 2(c) is then, in the presence or not of the etch mask 4, subjected to an etching process, so as to carry out the simultaneous etching of the reference layer 31 and of the raised element 32 resulting from the previous etching. In this operation, the raised element 32 serves as an auxiliary mask for the etching of the reference layer 31 and the formation of the vertical element at the top of the inverted-T-shaped step 31, such as shown by FIG. 2(d), after implementing the steps g), h) and i) of the method described in relation to FIGS. 2(a)-2(c) which is a subject according to the invention in its second embodiment. Of course, it will be understood that the etching is finally stopped by end-of-etch detection on the upper stop layer 22 when all the silicon of the upper reference layer 32 has been removed.

Of course, a slight overetching is always necessary so as to be certain to have completely removed the silicon on the upper stop layer 22.

A more detailed description of an integrated circuit comprising at least one etched layer in accordance with one or other of the embodiments of the method which is a subject of the invention, such as described in conjunction with the preceding FIGS. 1(a)-1(f) and 2(a-

)-2(d), will now be given in conjunction with FIGS. 3 and 4, respectively.

Figure 3:
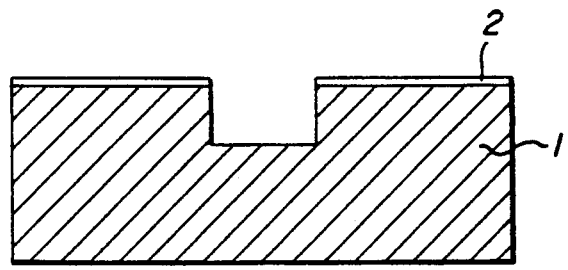
FIG. 3 shows a view, in cross-section, of an integrated circuit in which the etching to a fixed depth has been carried out in accordance with the method according to the invention.

According to FIG. 3, the integrated circuit obtained following the implementation of the method which is a subject of the invention such as illustrated in FIG. 1, comprises at least in a substrate 1 of specified material, one channel-type zone. The free surface of the substrate in the vicinity of the channel-type zone comprises a covering of a layer 2, made of a material different from that of the substrate, forming a stop layer. In one embodiment, the substrate 1 constituting a layer to be etched will be constituted by silicon and the stop layer will be constituted by silicon oxide $SiO_2$.

Figure 4:
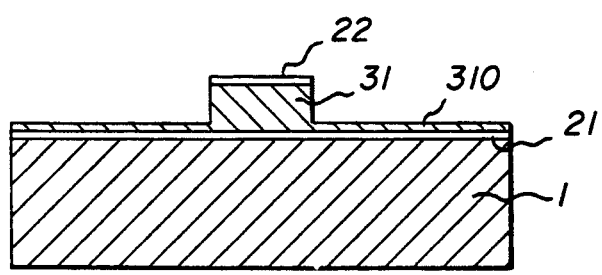
FIG. 4 shows a view, in cross-section, of an integrated circuit in which an inverted T-shaped element has been produced in accordance with the method according to the invention.

Furthermore, as shown in FIG. 4, the integrated circuit obtained by the implementation of the method such as illustrated in FIG. 2 comprises, at least on a substrate 1 of specified material, one projection-type zone 31, this projection-type zone being formed by the same material superposed on the surface of the substrate 1 and having substantially the shape of an inverted T. Most often, the substrate 1 made of a specified material is constituted by silicon Si, the inverted-T-shaped projection-type element being constituted by this same material.

As has been shown in FIG. 4, the projection-type zone 31 is made between its distal part and its base part between two layers 21-22 of the same material, different from that of the substrate and forming a stop layer. Most often, the layers 21-22 are produced from silicon dioxide $SiO_2$, whereas the substrate 1 is itself made from silicon Si.

Furthermore, as has been shown in FIG. 4, the thickness of the layer 22 covering the distal part of the inverted-T-shaped projection-type zone is substantially equal to that of the part 310 forming the base of the projection-type zone.

The embodiment of the method which is a subject of the invention such as shown in FIGS. 2(a)-2(d) is not limited to the production of elements having strictly an inverted-T shape. In fact, the abovementioned method makes it possible to etch a total thickness in two steps:
starting the etching process by a chemical attack, and then
continuing, after detection of the stop layer 22, with a chemical attack of another type.

Figure 5A:
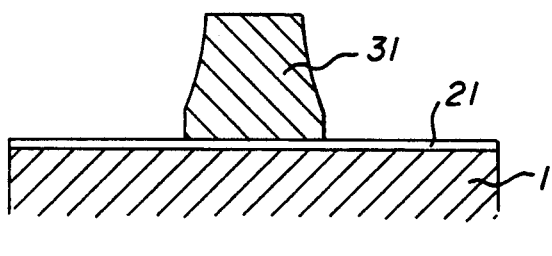
FIGS. 5(a) and 5(b) shows a view, in cross-section, of an integrated circuit in which an element has been produced by means of a variant of the method according to the invention such as illustrated in FIG. 2.
Figure 5B:
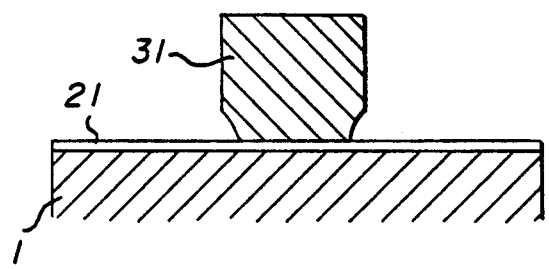

Such a variant of the abovementioned method then makes it possible to produce a final shape different from that of an inverted T in the strict sense, the etch edges being able to be totally or partially slanting or curved as shown in FIGS. 5(a) and 5(b).

Thus, there has been described a method for etching to a fixed depth in which, by virtue of the addition of a reference layer onto a stop layer, the reference layer being made of a similar material from the point of view of the etching of the material constituting the layer to be etched, a fixed-time etch is connected to a fixed-depth etch.

It will be noted that the method which is the subject of the invention, in its first and in its second embodiment, renders the etching between integrated-circuit wafers of the same batch totally reproducible. This etching also becomes insensitive to a process variation or to a change of machine, provided that the reference layer and indeed the upper reference layer, have the same etching properties as the layer to be etched. Such insensitivity is explained as follows: if the etching slows down, it is the same for the layers to be etched, that is to say the reference layer and the effective layer to be etched. Because of this, the final etched thickness in the layer to be etched is the same. However, the method which is the subject of the present invention remains sensitive to the etching inhomogeneities which are connected to the etching method itself, it not being method for these inhomogeneities themselves to be avoided. However, it will be noted that the introduction of a short overetching time makes it possible to be certain that the etching of the reference layer or of the upper reference layer has been really completed.

I claim:
1. A method for etching a layer of material of an integrated circuit, over a fixed depth, said method consisting of:
   a) depositing onto said layer of material designated as the layer to be etched, a protective layer forming a stop layer,
   b) depositing onto said stop layer a reference layer made of a material identical to that of the layer to be etched and whose thickness is made substantially equal to the depth of the etch to be produced in said layer to be etched,
   c) applying to said reference layer an etch mask having the plane dimensions of the etch to be produced in said layer to be etched,
   d) carrying out the etching by chemical attack, dry or wet, of said reference layer by the intermediary of the etch mask until encountering and exposing a portion of the stop layer in a zone for etching the reference layer,
   e) removing said mask and said exposed stop layer;
   f) simultaneously subjecting the reference layer, remaining stop layer and the layer of material to be etched in the region of said zone liberated by the removal of the exposed stop layer to a chemical attack, dry or wet, until the remaining stop layer underneath said reference layer is exposed, the reference layer and the remaining stop layer forming an auxiliary mask for the layer to be etched so as to create, in the layer to be etched, an etch having the plane dimensions of the etch of the reference layer and a depth substantially proportional to the thickness of this reference layer.

2. The method as claimed in claim 1,
wherein the layer to be etched in constituted by a material included in the group $SiO_2$, $Si_3N_4$, Si.

3. The method as claimed in claim 1,
wherein the thickness dimension of the reference layer is made equal to a value proportional to the dimension, in the same direction, of the etch to be produced, the ratio of proportionality of these dimensions being made equal, for compatible materials constituting said reference layer, and for appropriate etch modes or etchants with respect to the layer of material to be etched and to the reference layer, to the ratio of the corresponding etch rates.

4. The method as claimed in claim 3, wherein, when the layer to be etched and the reference layer are made of identical material, said dimensions are identical, said reference layer and said layer to be etched being subjected, with a view to their etching, to the same etch modes or etchants.

5. The method as claimed in either of claims 3 and 4, wherein the etch modes or etchants are chosen from among the agents $SF_6$, $C_2F_6$, HCl, $Cl_2$, $CHF_3$, $CF_4$, $O_2$.

6. A method for providing a raised element into a layer of material of an integrated circuit comprising:

a) depositing onto said layer of material designated as the layer to be etched, a protective layer forming a lower stop layer, b) depositing onto said lower stop layer a lower reference layer made of a material identical to that of the layer to be etched and whose thickness is made substantially equal to the depth of the etch to be produced in said layer to be etched, c) depositing onto said lower reference layer an upper stop layer, d) depositing onto said second stop layer an upper reference layer of the same type and same thickness as said lower reference layer, e) applying to said upper reference layer an etch mask, f) carrying out etching by chemical attack, dry or wet, of said upper reference layer by the intermediary of the etch mask until the lower reference layer is exposed, g) removing the etch mask, and h) simultaneously subjecting the remaining upper reference layer, remaining upper stop layer and the exposed lower reference layer to a chemical attack, dry or wet, until the remaining upper stop layer underneath said upper reference layer is exposed so as to form said raised element from said lower reference layer underneath said remaining upper stop layer.

* * * * *